June 30, 1964 H. J. BROWN 3,139,575

CONTROLLED RECTIFIER CIRCUIT

Filed Jan. 26, 1961

INVENTOR.
HAROLD J. BROWN
BY
Lockwood, Woodard, Smith & Weikart
Attorneys 3,139,575

CONTROLLED RECTIFIER CIRCUIT

Harold J. Brown, 6947 N. College Ave., Indianapolis, Ind.

Filed Jan. 26, 1961, Ser. No. 85,055
7 Claims. (Cl. 321—18)

This invention is related generally to power supplies and more particularly to A.C. to D.C. power supplies controlled by a source of power at low level.

Although controlled rectifier circuits using, for example, thyratrons are well known, employment of solid state devices in such circuits generally involves the use of three-junction devices such as the silicon controlled rectifier. Such three junction devices are inherently difficult of manufacture as compared to two junction solid state devices. This is reflected in the price of a silicon controlled rectifier compared to a transistor. However, even though there is a substantial cost differential between transistors and silicon controlled rectifiers, transistors have not, heretofore, been successfully employed in controlled rectifiers. Particularly is this true in applications where control of a significant amount of power was required.

One of several reasons transistors can't be used successfully in conventional controlled rectifier circuitry is the fact that a transistor is slow of switching as compared to a silicon controlled rectifier. Moreover, transistors are subject to damage when used with conventional circuitry. For example, when transistor is turned off, a high potential is frequently generated across the emitter-collector path in the transistor due to energy stored in the load. The tendency when this occurs is to induce leakage currents greater than normal with attendant generation of heat and deterioration of the transistor.

There are additional unfavorable factors when transistors are used in conventional circuitry, such as interaction between the controlled power and the controlling source. For example, when transistors are turned on, the current in the base circuit may rise to levels where a sensitive control signal source coupled to the base circuit can easily be damaged. This, of course, not only is detrimental to the signal source itself but also renders accurate control of the transistor impossible.

It is, therefore, a general object of this invention to provide a controlled rectifier circuit employing solid state devices, which is more economical of construction than those heretofore known.

It is another object of this invention to provide a controlled rectifier circuit effectively employing transistors.

It is a further object of this invention to provide a controlled rectifier circuit wherein power supplied to a load is precisely and positively controlled so that the power is either on or off.

It is a still further object of this invention to provide a controlled rectifier circuit incorporating transistors and employing a very low power control signal supplied by a control source to control a large amount of power for the load and wherein an induced current in the base circircuit is employed to sustain conduction during a desired period without interference with or from the control source.

It is a still further object of this invention to provide a controlled rectifier circuit incorporating transistors wherein transistors are protected from transient effects upon cessation of conduction through the transistors.

It is a still further object of this invention to provide a controlled rectifier circuit wherein a transistor may be locked into conduction after initiation of current flow therethrough, by means of current induced in the base circuit thereof through a saturable transformer in response to current flowing in the collector circuit thereof.

This invention includes in its scope a controlled rectifier having an alternating current power source, a direct current control source of reversible polarity, and a direct current load. The power source energizes a coupling transformer having a center-tapped secondary winding. Each half of the secondary winding forms a part of a branch circuit which includes a transistor having an emitter-collector path coupled in series through a primary winding of a saturable transformer and a rectifying diode. A load is coupled across the combination of the half of the secondary winding and the portion of the branch circuit above mentioned and completes the branch circuit. There are two branch circuits with the load being common to both to provide for full wave rectification. The primary windings of the saturable transformers of the two branches are wound on a common core but on opposite legs thereof.

Control of the transistor in each branch is provided for by means of a control source coupled to the emitter-base path of the transistor and through a portion, usually one-half, of a tapped secondary winding of the saturable transformer to the base of the transistor. The other half of the secondary winding of the saturable transformer is returned to the control source through a balancing diode.

Upon initiation of current flow through the transistor in one or the other of the branches, the current in the collector circuit passing through the primary winding of the saturable transformer induces a current in the secondary winding connected to the base circuit of the said transistor whereby the transistor is locked into conduction. The induced current cannot affect the control source or be affected thereby because the secondary winding of the saturable transformer is returned to the emitter through a balancing diode, establishing emitter potential at the control source tap point.

When the potential applied across the branch circuit by the secondary winding of the coupling transformer reverses in polarity, the rectifier in the collector circuit of the transistor shuts it off, whereupon the magnetic energy in the saturable transformer locks the aforementioned transistor out of conduction.

A diode and resistance in series are coupled across the load so that upon lock-out of the transistor the voltage across the emitter-collector path thereof is maintained at a level low enough to avoid excessive leakage and heat dissipation in the transistor.

The full nature of the invention will be understood from the accompanying drawing and the following description and claims:

Figure 1:
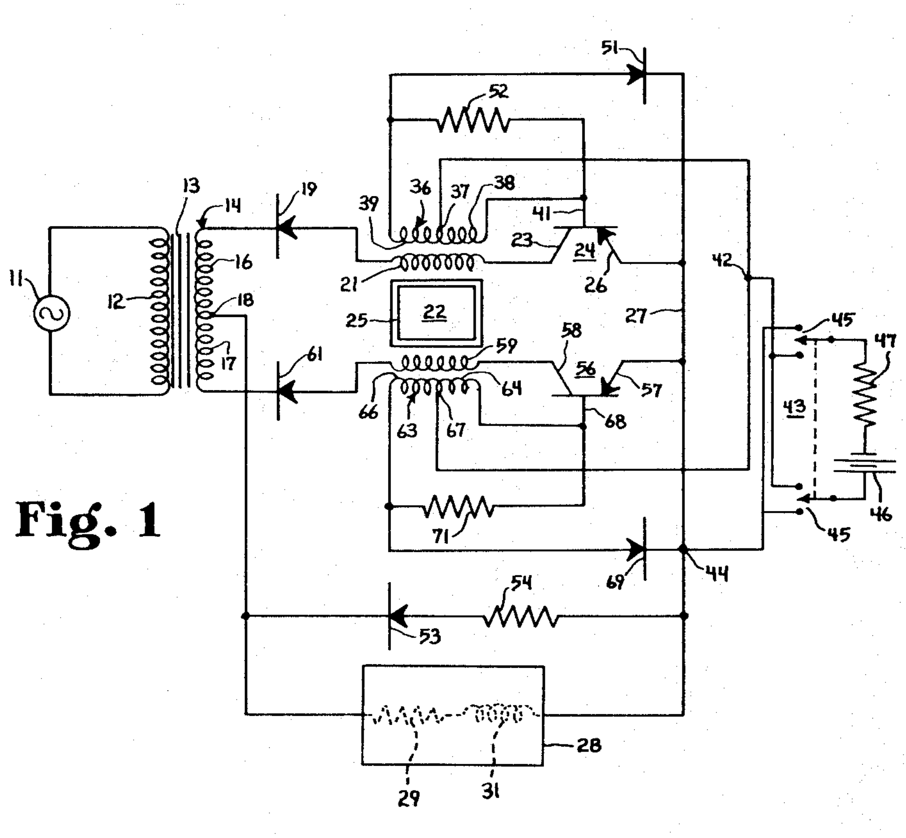
FIG. 1 is a schematic representation of a typical embodiment of my invention showing an A.C. to D.C. model controlled by D.C.

Referring to FIG. 1, a source 11 of alternating current electrical energy is connected across the primary winding 12 of the coupling transformer 13. The secondary winding 14 of coupling transformer 13 may be center-tapped at 18 to provide winding portions 16 and 17. A first branch circuit includes a rectifier 19, which may be a diode, coupled to the secondary winding portion 16 and coupled through a primary winding 21 of saturable transformer 22 to the collector 23 of the P-N-P transistor 24. The emitter 26 of transistor 24 is connected through lead 27 to one end of the load 28 having resistance 29 and inductance 31 represented schematically by the dotted lines. A variety of loads can be supplied by my invention and just one example would be the operating coil of a relay. The other end of the load 28 is connected to the tap 18 of the secondary winding of coupling transformer 13 to complete the first branch circuit.

The saturable transformer 22 has a first secondary winding 36 tapped at 37, thereby to provide a first portion 38 and a second portion 39. Portion 38 is coupled at one end to the base 41 of transistor 24. The tap 37 is connected to junction 42 which is connected to one side of a control means 43. The other side of the control means 43 is coupled through junction 44 to the emitter 26 of transistor 24.

The control means 43 provides a source of control signals and may comprise a battery 46 and resistance 47 or the equivalent thereof, together with suitable switches 45 for reversing the polarity of voltage applied to the junctions 42 and 44. The control means 43, although represented by a battery and switches, is usually one capable of supplying direct current reversible in polarity. It may be any of many sources employed in industry and well known to those skilled in the art and they include, for example, a phase detector.

The second portion 39 of the winding 36 is coupled through a rectifier 51 which may conveniently be a diode, to the emitter 26 with the diode oriented to provide low resistance to flow of positive current in the direction from winding 36 to the emitter 26. Rectifier 51 has a forward conduction voltage-current characteristic, similar to the base-emitter conduction characteristic of transistor 24. A damping resistance 52 is connected across the winding 36.

28 — BELL — Nite — Pat — 06109 — JUNE — 10

A rectifier 53 is connected in series with a resistance 54 across the load 28 with the rectifier oriented to provide low resistance to the flow of positive current in the direction from the emitter 26 to center-tap 18 of the secondary winding of coupling transformer 13.

The second branch circuit includes a transistor 56 having an emitter 57 connected in common with emitter 26 of transistor 24. The transistor 56 has a collector 58 coupled to a second primary winding 59 of saturable transformer 22. Winding 59 is coupled in turn through rectifier 61 to the secondary winding portion 17 of coupling transformer 13. The rectifier 61 is oriented to provide low resistance to the flow of positive current from the winding 59 to the winding portion 17. The second branch circuit is completed through the portion 17 and the load 28 to the emitter 57 of transistor 56.

Saturable transformer 22 has a second secondary winding 63 tapped at 67 to provide a first portion 64 and a second portion 66. Portion 64 of the secondary winding 63 couples the base 68 of transistor 56, its corresponding transistor, to the junction 42 and thereby to the control source 43. Portion 66 of winding 63 is coupled through the rectifier 69 and junction 44 to the emitter 57 of transistor 56. The rectifier 69 is oriented to provide a low resistance to the flow of positive current in the direction from winding 66 to the emitter 57. Rectifier 69 has a forward conduction voltage-current characteristic, similar to the base-emitter conduction characteristic of transistor 56. A damping resistance 71 is connected across the secondary winding 63 of the saturable transformer 22.

For purposes of example only, some representative components employed in the embodiment of my invention shown in FIG. 1 are as follows:

11—115 v.-60 cycle A.C.
12—Transformer 115 v. to 25 v.
14—25 v. 0.1 amp
19—1N91 Germanium Rectifier
61—1N91 Germanium Rectifier
24—Texas Inst. 2N1038 Germanium Transistor
56—Texas Inst. 2N1038 Germanium Transistor
28—Relay D.C. 120 ohm D.C. resistance
21—Saturable transformer collector winding—75 turns #30 copper wire
36—Saturable transformer base winding—1000 turns #40 copper wire
25—Core 1DU, ¼ in. stack HiMu80
51—1N91 Germanium Diode
52, 71—470 ohm ½ watt resistor

43—Control source 20 m.v.-1000 ohm producing 20 microamp control current
53—1N91 Germanium Diode
54—27 ohm ½ watt resistor It should be noted that each winding pair of primary and secondary windings of the saturable transformer is wound on a leg of the core 25 opposite the other winding pair. A typical turns ratio between the primary windings and secondary windings of the saturable transformer 22 may be in the order of 1 to 10. Therefore, by transformer action, the collector-to-base current ratio for one of the transistors during conduction may be in the order of 10 to 1.

Figure 2:
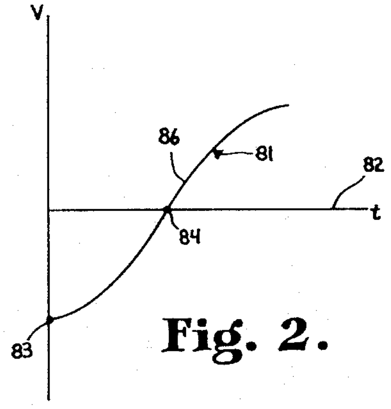
FIG. 2 is a curve representing voltage input and used as an aid to description of operation.

In FIG. 2 curve 81 is a time *t* representation of the voltage induced in the secondary winding 14 of coupling transformer 13. Portions below abscissa 82 represent voltages V tending to produce flow of positive current in the direction from rectifier 19 toward rectifier 61. For purposes of explanation these will be considered voltages of negative polarity. Portions above abscissa 82 represent voltages of opposite polarity.

*Operation*

To explain the operation of my invention it is first helpful to assume that the polarity of the alternating current voltage at source 11 is such that the rectifier 19 may conduct the current induced in the secondary winding portion 16 of the transformer 13. The voltage induced in the secondary winding would be represented below the line 82 in FIG. 2. Rectifier 61 would, of course, oppose flow of current in its branch. With the control source 43 applying a control current of positive polarity to the base 41 of transistor 24, greater in magnitude than the collector-base cut-off current, the transistor 24 will be cut off so that only the minimum collector cut-off current can flow therethrough, and the power delivered to the load 28 will be nearly zero. This can continue for any number of cycles of alternating current energy at the source 11 and a normal potential is established on the emitter and collector of transistor 24 during alternate half cycles of alternating current energy at source 11 in response to the potential existing at the secondary winding portion 16.

Reversal of the polarity of control current from the source 43 providing a control current of negative polarity, will increase the leakage of transistor 24 several hundred times, sufficient to induce a flux change in core 25 from winding 21. Saturable transformer 22 will now act as a current transformer, establishing by transformer action a collector to base current ratio of ten.

Since transistor 24 will always have a forward current ratio in excess of ten, the transistor 24 must become fully conducting or saturated. Power is thereby applied to the load 28.

Balancing diode 51 has characteristics similar to the emitter-base diode of transistor 24. Therefore, the base current generated in winding 36 will return to the emitter without interference from the control source 43. Furthermore, the control current supplied by source 43 will not be affected by the triggering of conduction as the balancing action of diode 51 against the emitter-base diode of transistor 24 will leave the tap point 37 at emitter potential.

Let us assume that transistor 24 has been triggered into conduction at the peak of the AC voltage cycle by virtue of the current supplied from control source 43. This peak voltage may be represented in FIG. 2 at point 83 on curve 81. Avalanche occurs almost instantly after which the flow of current through primary winding 21 induces, by the saturable transformer action, flow of current through secondary winding 36. It has been noted above that the transistor characteristically has a forward current ratio in excess of ten and that the saturable transformer turns ratio is of the order of ten to one. Therefore, the base current induced in winding 36 by the collector current in winding 21 is always adequate to keep the transistor turned on during the remainder of the half cycle of A.C. at transformer 13. Transistor 24 is "locked" into conduction by virtue of the transformer action of the saturable transformer. Load 28, of course, includes a certain amount of inductance, also tending to maintain the load current.

At the end of the half cycle, point 84 in FIG. 2, when the voltage induced in winding 16 reverses polarity, rectifier 19 tends to stop further conduction through the collector of transistor 24. Then, just as transformer 22 locked transistor 24 into conduction, so it will lock it out of conduction almost instantly at the end of the cycle. The positive voltage induced in the secondary winding 36, by desaturation of transistor 24 resulting from the magnetic energy in core 25, will instantly lock out transistor 24.

The positive voltage of lock out appearing across resistor 52, will be transmitted magnetically through transformer 22 and will appear in an attenuated form of negative polarity to the base of transistor 56. The leakage inductance between the opposite winding pairs and resistor 71 will produce the attenuation because the windings are on opposite legs of core 25. If the control current from means 43 remains negative, such as it was when transistor 24 was turned on, transistor 56 will lock into conduction as the polarity of voltage induced in winding 14 becomes positive (portion 86 of curve 81 in FIG. 2). On the other hand, if the polarity of the control current has become positive during the remainder of the half cycle (between point 83 and 84 on curve 81 in FIG. 2) after transistor 24 is turned on, the attenuated negative triggering pulse combined with the low voltage from the A.C. source will be insufficient to trigger transistor 56 into conduction when the voltage in winding 14 becomes positive (portion 86 of curve 81). The current in load 28 will decay through diode 53 and resistor 54.

Thus a small value of control power at means 43 will, within one-half cycle, control a large amount of power to the load, of the order of 10 times greater than the control power. For example, the transistors can easily be controlled with a base current of 10 microamps at 10 millivolts. Moreover, my invention has also a high degree of reliability since the transistors are not subject to energy dissipation or voltage impulses. Resistor 54 always absorbs the inductive energy of the load on turn off, and the transistors are rendered nonconductive at low collector voltage. Accordingly, my invention can use comparatively inexpensive components and yet achieve better results than are ordinarily obtained with expensive components. For example, this invention makes it unnecessary to employ an expensive transistor and derate it i.e., use one adequate to handle transients in a circuit where it is normally operated at considerably less than its rated capacity. Moreover, this invention performs work which is normally assigned to silicon controlled rectifiers and does so with less expense. It makes a transistor function like a Thyratron. The invention also has an advantage in that it provides for turning on transistors without involving the control source. This feature is readily appreciated when one recognizes that many sources available for control signals have high impedance, low current characteristics and could be easily damaged upon the firing of a transistor.

While half wave operation of my invention with the elimination of one branch circuit has been contemplated, the desirability of a full wave embodiment is greater by more than a factor of 2. It should also be understood that my invention can be employed with other types and arrangements of semiconductor devices including N-P-N transistors.

Therefore, while the invention has been disclosed and described in some detail in the drawings and the foregoing description, they are to be considered as illustrative and not restrictive in character, as other modifications may readily suggest themselves to persons skilled in this art and within the broad scope of the invention, reference being had to the appended claims.

The invention claimed is:

1. A rectifier controllable for energizing and deenergizing a load device comprising a source of electrical pulses, first and second branch circuits coupled to said source and said load device, a unidirectional device in each branch circuit responsive to pulses of predetermined polarity to energize said branch circuits alternatively, a saturable transformer including a first primary winding in said first branch circuit and a second primary winding in said second branch circuit, said windings being wound on opposite legs of a common core, a semi-conductor device in each branch circuit and including a collector coupled to one of said primaries, an emitter coupled to said load device, and a base whereby a certain normal potential is established on said collector and emitter, said saturable transformer including a first secondary winding associated with the primary winding of said first branch circuit and coupled to the base of the semi-conductor device therein and also including a second secondary winding associated with the primary winding of said second branch circuit and coupled to the base of the semi-conductor device therein, each of said secondary windings having a tap point therein, a source of control signals of different polarities, and means coupled between said control signal source and said secondary for coupling said source of control signals in opposite polarity to either of said secondary windings to change the bias on said semi-conductor devices to initiate flow of power from said pulse source to said load device, said saturable transformer maintaining flow of power by induction, and a unidirectional device coupled between the tap point of each of said secondary windings and the emitter of the semi-conductor device to the base of which the secondary winding is coupled, to avoid production of current through said control source in response to the flow of power to said load device.

2. A rectifier controllable for energizing and deenergizing a load device and comprising: a source of electrical pulses, first and second branch circuits coupled to said source and said load device, a unidirectional device in each branch circuit responsive to pulses of predetermined polarity to energize said branch circuits alternatively, a saturable transformer including a first primary winding in said first branch circuit and a second primary winding in said second branch circuit, said windings being wound on opposite legs of a common core, a semi-conductor device in each branch circuit and including a collector coupled to one of said primaries, an emitter coupled to said load device, and a base, whereby a certain normal potential is established on said collector and emitter, said saturable transformer including a first secondary winding associated with the primary winding of said first branch circuit and coupled to the base of the semi-conductor device therein and also including a second secondary winding associated with the primary winding of said second branch circuit and coupled to the base of the semi-conductor device therein, each of said secondary windings having a tap point therein, a source of control signals of different polarities, and means coupled between said control signal source and said secondary for coupling said source of control signals in opposite polarity to either of said secondary windings to change the bias on said semi-conductor devices to initiate flow of power from said pulse source to said load device, said saturable transformer maintaining flow of power by induction, and a unidirectional device coupled between the tap point of each of said secondary windings and the emitter of the semi-conductor device to the base of which the secondary winding is coupled, to avoid production of current through said control signal source in response to the flow of power to said load device, and damping resistances each coupled to the base of a semi-conductor device and to the saturable transformer secondary winding coupled to the semi-conductor device, whereby a transistor is locked out of conduction upon cessation of power flow in the branch circuit in which said transistor is coupled.

3. A controlled rectifier comprising: input means for a source of electrical energy; a saturable transformer having a primary winding and a secondary winding and a core common to said windings; a branch circuit; coupling means inductively coupling said input means to said branch circuit, said branch circuit including a first unidirectional means coupled between said coupling means and said primary winding of the saturable transformer, a semi-conductor device having an emitter-collector path coupled to said primary winding and having a base, and a load coupled between said coupling means and the emitter-collector path completing the branch circuit; a tap point in the secondary winding of said saturable transformer, dividing said winding into a first and second portion with the first portion coupled to the base of the semi-conductor device in said branch circuit; a control means for producing potentials of reversible polarity coupled to the emitter of said semi-conductor device and coupled through the first portion of the secondary winding of said saturable transformer to the base of said semi-conductor device for controlling conduction of said semi-conductor device; and balancing means coupled between the second portion of the secondary winding of said saturable transformer and the emitter of said semi-conductor device to hold the tap point of the said secondary winding at emitter potential of the semi-conductor device during conduction of electrical energy through said device, whereby a small amount of power introduced at said control means reliably and safely controls a large amount of power in the load and the control means is protected when the semi-conductor device is rendered conducting.

4. A controlled rectifier comprising: input means for a source of electrical energy; a saturable transformer having primary windings and secondary windings and a core common to said windings; first and second branch circuits; coupling means inductively coupling said input means to said first and second branch circuits, each of said branch circuits including a first unidirectional means coupled between said coupling means and a primary winding of the saturable transformer, a semi-conductor device having an emitter-collector path coupled to said primary winding and having a base, and a load coupled between said coupling means and the emitter-collector path completing each branch circuit; a tap point in each winding of said pair of secondary windings of said saturable transformer dividing said winding into a first and second portion with each first portion coupled to the base of a semi-conductor device in one of said branch circuits; a control means for producing potentials of reversible polarity coupled to the emitters of said semi-conductor devices and coupled through the first portions of both secondary windings of said saturable transformer to the bases of said semi-conductor devices for controlling conduction of said semi-conductor devices; and balancing means coupled between the second portions of the secondary windings of said saturable transformer and the emitters of said semi-conductor devices to hold the tap point of a winding at emitter potential of the semi-conductor device coupled to the winding during conduction of electrical energy through said device, whereby a small amount of power introduced at said control means reliably and safely controls a large amount of power in the load and the control means is protected from surges when a semi-conductor device is rendered conducting.

5. A controlled rectifier comprising: input means for a source of electrical energy; a saturable transformer having primary windings and secondary windings and a core common to said windings; first and second branch circuits; coupling means inductively coupling said input means to said first and second branch circuits, each of said branch circuits including a first unidirectional means coupled between said coupling means and a primary winding of the saturable transformer, a semi-conductor device having an emitter-collector path coupled to said primary winding and having a base, and a load coupled between said coupling means and the emitter-collector path completing each branch circuit; a tap point in each winding of said pair of secondary windings of said saturable transformer dividing said winding into a first and second portion with each first portion coupled to the base of a semi-conductor device in one of said branch circuits; a control means for producing potentials of reversible polarity coupled to the emitters of said semi-conductor devices and coupled through the first portions of both secondary windings of said saturable transformer to the bases of said semi-conductor devices for controlling conduction of said semi-conductor devices; balancing means coupled between the second portions of the secondary windings of said saturable transformer and the emitters of said semi-conductor devices to held the tap point of a winding at emitter potential of the semi-conductor device coupled to the winding during conduction of electrical energy through said device; and damping resistance coupled across each secondary winding of said saturable transformer, whereby a small amount of power introduced at said control means reliably and safely controls a large amount of power in the load and the control means is protected from surges when a semi-conductor device is rendered conducting.

6. A controlled rectifier comprising: input means for a source of electrical energy; a saturable transformer having primary windings and secondary windings and a core common to said windings; first and second branch circuits; coupling means inductively coupling said input means to said first and second branch circuits, each of said branch circuits including a first unidirectional means coupled between said coupling means and a primary winding of the saturable transformer, a semi-conductor device having an emitter-collector path coupled to said primary winding and having a base, and a load coupled between said coupling means and the emitter-collector path completing each branch circuit; a tap point in each winding of said pair of secondary windings of said saturable transformer dividing said winding into a first and second portion with each first portion coupled to the base of a semi-conductor device in one of said branch circuits; a control means for producing potentials of reversible polarity coupled to the emitters of said semi-conductor devices and coupled through the first portions of both secondary windings of said saturable transformer to the bases of said semi-conductor devices for controlling conduction of said semi-conductor devices; balancing means coupled between the second portions of the secondary windings of said saturable transformer and the emitters of said semi-conductor devices to hold the tap point of a winding at emitter potential of the semi-conductor device coupled to the winding during conduction of electrical energy through said device; damping resistance coupled to the secondary winding of said saturable transformer; and a unidirectional means and resistance in serial coupling across the load for dissipation of energy stored in said load when a semi-conductor device is rendered non-conducting whereby the semi-conductor devices are protected from surges at turn-off, and a semi-conductor device is immediately locked out of conduction at turn-off, and a small amount of power introduced at said control means, reliably and safely controls a large amount of power in the load and the control means is protected from surges when a semi-conductor device is rendered conducting.

7. A controlled rectifier comprising: input means for a source of electrical energy; a saturable transformer having primary windings and secondary windings and a core common to said windings; first and second branch circuits; a coupling transformer having a primary winding coupled to said input means and having a tapped secondary winding with a first and second section having a tap therebetween and coupled to said first and second branch circuits respectively, each of said branch circuits including a first diode coupled between the secondary of said coupling transformer and a primary winding of the saturable transformer, said diode being oriented to provide low resistance to flow of positive current from said saturable transformer winding to said secondary, a transistor having an emitter-collector path coupled to said primary winding and having a base, and a load having resistance and inductance characteristics and coupled between said tap of the secondary winding of the coupling transformer and the emitter of the said transistor completing each branch circuit; a tap point in each winding of said pair of secondary windings of said saturable transformer dividing said winding into a first and second portion with each first portion coupled to the base of a transistor in one of said branch circuits; a control means for producing potentials of reversible polarity coupled to the emitters of said transistors and coupled through the first portions of both secondary windings of said saturable transformer to the bases of said transistors for controlling conduction of said transistors; balancing diodes each coupled between the second portion of a secondary winding of said saturable transformer and the emitter of the transistor having its base coupled to the secondary winding of the saturable transformer, each said diode having similar characteristics to the emitter-base diode of the transistor to which it is coupled and oriented for low resistance to the flow of positive current from the said second portion to said emitter to hold the tap point of a winding of the saturable transformer at the emitter potential of the transistor coupled to the winding during conduction of electrical energy through said transistor; damping resistance coupled across each secondary winding of said saturable transformer; and a diode and resistance in serial coupling across the load for dissipation of energy stored in said load when a semi-conductor device is rendered non-conducting, said diode in serial coupling being oriented to provide low resistance to the flow of positive current from the emitters to the tap point of the secondary winding of the coupling transformer, whereby the transistors are protected from surges at turn off, and a small amount of power introduced at said control means reliably and safely controls a large amount of power in the load and the control means is protected from surges when a transistor is rendered conducting.

References Cited in the file of this patent

UNITED STATES PATENTS

| | | |
|---|---|---|
| 2,310,101 | Lord | Feb. 2, 1943 |
| 2,806,963 | Woll | Sept. 17, 1957 |
| 3,045,174 | Lafuze | July 17, 1962 |

FOREIGN PATENTS

| | | |
|---|---|---|
| 1,074,740 | Germany | Feb. 4, 1960 |